(12) United States Patent
Yoshimura et al.

(10) Patent No.: US 9,633,715 B2
(45) Date of Patent: Apr. 25, 2017

(54) SEMICONDUCTOR DEVICE CAPABLE OF ATTAINING GROUND STATE IN AN ISING MODEL

(71) Applicant: Hitachi, Ltd., Chiyoda-ku, Tokyo (JP)

(72) Inventors: Chihiro Yoshimura, Tokyo (JP); Masanao Yamaoka, Tokyo (JP); Tomonori Sekiguchi, Tokyo (JP); Tatsuya Tomaru, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/890,335

(22) PCT Filed: May 31, 2013

(86) PCT No.: PCT/JP2013/065275
§ 371 (c)(1),
(2) Date: Nov. 10, 2015

(87) PCT Pub. No.: WO2014/192153
PCT Pub. Date: Dec. 4, 2014

(65) Prior Publication Data
US 2016/0118106 A1    Apr. 28, 2016

(51) Int. Cl.
*G11C 11/419* (2006.01)
*G06F 7/58* (2006.01)
(Continued)

(52) U.S. Cl.
CPC ............ *G11C 11/419* (2013.01); *G06F 7/588* (2013.01); *G06N 3/08* (2013.01); *G11C 11/1675* (2013.01)

(58) Field of Classification Search
CPC ........ G06N 3/08; G06N 99/002; G06N 7/005; G06F 19/701; G06F 7/588; G11C 11/419; G11C 11/1675
See application file for complete search history.

(56) References Cited

U.S. PATENT DOCUMENTS 8,374,021 B2    2/2013 Kanai et al.
2004/0125647 A1*    7/2004 Tsuchida ............... G11C 11/15
                                                        365/158
(Continued)

FOREIGN PATENT DOCUMENTS

JP    2010-182258 A    8/2010
WO    WO 2012/118064 A1    9/2012

OTHER PUBLICATIONS

Schaller, Gernot, et al.; The role of symmetries in adiabatic quantum algorithms; arXiv:0708.1882v2 [quant-ph]; Apr. 29, 2009; pp. 1-18.
(Continued)

*Primary Examiner* — Richard Elms
*Assistant Examiner* — Ajay Ojha
(74) *Attorney, Agent, or Firm* — Foley & Lardner LLP

(57) ABSTRACT

It is an object of the present invention to provide a device which can be easily manufactured and obtain a ground state of an arbitrary Ising model. A semiconductor device includes a first memory cell and a second memory cell that interacts with the first memory cell, in which storage content of the first memory cell and the second memory cell is stochastically inverted. The storage content is stochastically inverted by dropping threshold voltages of the first memory cell and the second memory cell. The threshold voltages of the first and second memory cells are dropping by controlling substrate biases, power voltages, or trip points of the first and second memory cells.

15 Claims, 11 Drawing Sheets

(51) Int. Cl.
  *G06N 3/08*     (2006.01)
  *G11C 11/16*    (2006.01)

(56) References Cited

U.S. PATENT DOCUMENTS

| | | | | |
|---|---|---|---|---|
| 2005/0117387 A1* | 6/2005 | Hwang | ............. | G11C 13/0004 365/163 |
| 2012/0026784 A1* | 2/2012 | Kanai | .................... | G06F 7/588 365/158 |
| 2013/0322161 A1* | 12/2013 | Noguchi | ............. | G11C 11/1675 365/158 |
| 2014/0046626 A1 | 2/2014 | Yamamoto et al. | | |
| 2014/0081893 A1* | 3/2014 | Modha | .................... | G06N 3/08 706/25 |

OTHER PUBLICATIONS

PCT International Search Report on application PCT/JP2013/065275 mailed Jul. 9, 2013; 2 pages.

\* cited by examiner $$a_2 b_2 - \omega_4 = 0$$
$$a_1 b_2 - S_{21} = 0$$
$$a_2 b_1 + S_{21} - \omega_3 - 2z_{11} = 0$$
$$a_1 b_1 + z_{11} - \omega_2 - 2\omega_1 = 0$$

ABBREVIATED NOTATION

US 9,633,715 B2

SEMICONDUCTOR DEVICE CAPABLE OF ATTAINING GROUND STATE IN AN ISING MODEL

BACKGROUND

Technical Field

The present disclosure relates to a semiconductor device, and can be applied to a semiconductor device that obtains, for example, a ground state of an Ising model.

Background Art

Typically, an improvement in performance of computers depends on the development of semiconductor devices. A current mainstream Neumann-type computer sequentially executes programs, and an increase in an execution speed thereof mainly depends on an improvement in a clock frequency of a processor. However, the improvement in the clock frequency has peaked around 2000, and as an alternative countermeasure for improving the performance, a multi-core processor relying on size reduction of semiconductor devices and parallelization of programs for corresponding thereto are currently being used.

However, the size reduction of the semiconductor device is approaching a limit, and the parallelization of programs that are premised on the sequential execution is about to reach a limit as well. In light of this situation, in order to continuously improve the performance of the computer in future, it is necessary to implement a principle of new information processing which is different from the sequential execution of programs.

By the way, an Ising model is a statistical-mechanical model for describing behavior of a magnetic substance and used for study of magnetic substances. The Ising model is defined as interaction between sites (spins having two values of +1 and −1). Obtaining a ground state of the Ising model in which a topology is a non-planar graph is known as an NP-hard problem.

For this reason, if there is a device capable of obtaining the ground state of the Ising model, it is possible to solve various kinds of problems by converting them into a problem for obtaining the ground state of the Ising model. However, since the obtaining of the ground state of the Ising model is the NP-hard problem as described above, solving it through the Neumann-type computer poses a difficulty in terms of a computation time. An algorithm of introducing a heuristic technique and increasing a speed has been proposed, but a calculation using a physical phenomenon more directly rather than the Neumann-type computer, that is, a method of obtaining the ground state of the Ising model at a high speed has been proposed. As such a device, there is, for example, a device disclosed in Patent Literature 1.

If it is possible to convert a problem that is desired to be solved into the Ising model, more specifically, to convert a problem into an interaction coefficient between sites, it is possible to solve the problem through the above-described analog computer. In the Neumann-type computer of the related art, the problem is expressed by steps, which are sequential in a time direction, called an algorithm, and thus this results in interference with an increase in a speed. However, when the problem is converted into the Ising model, the problem is expressed as a parameter in a spatial direction which is an interaction coefficient between sites, and thus this is suitable for an increase in a speed.

In this regard, it is necessary to implement hardware capable of converting a problem that is desired to be solved into the Ising model and obtaining the ground state of the Ising model.

CITATION LIST

Patent Document

Patent Literature 1: WO 2012/118064 A

SUMMARY OF THE INVENTION

Technical Problems

In Patent Literature 1, a laser is used as hardware capable of obtaining the ground state of the Ising model, but it is difficult to manufacture a laser having a desired characteristic.

It is an object of the present disclosure to provide a device which can be easily manufactured and obtain a ground state of an arbitrary Ising model.

Solutions to Problems

An overview of a representative example of the present disclosure is described as follows. A semiconductor device includes a first memory cell and a second memory cell that interacts with the first memory cell, in which storage content of the first memory cell and the second memory cell is stochastically inverted.

Effects of the Invention

According to the semiconductor device, it is possible to easily manufacture a device that obtains a ground state of an arbitrary Ising model.

DESCRIPTION OF EMBODIMENTS

Figure 1:
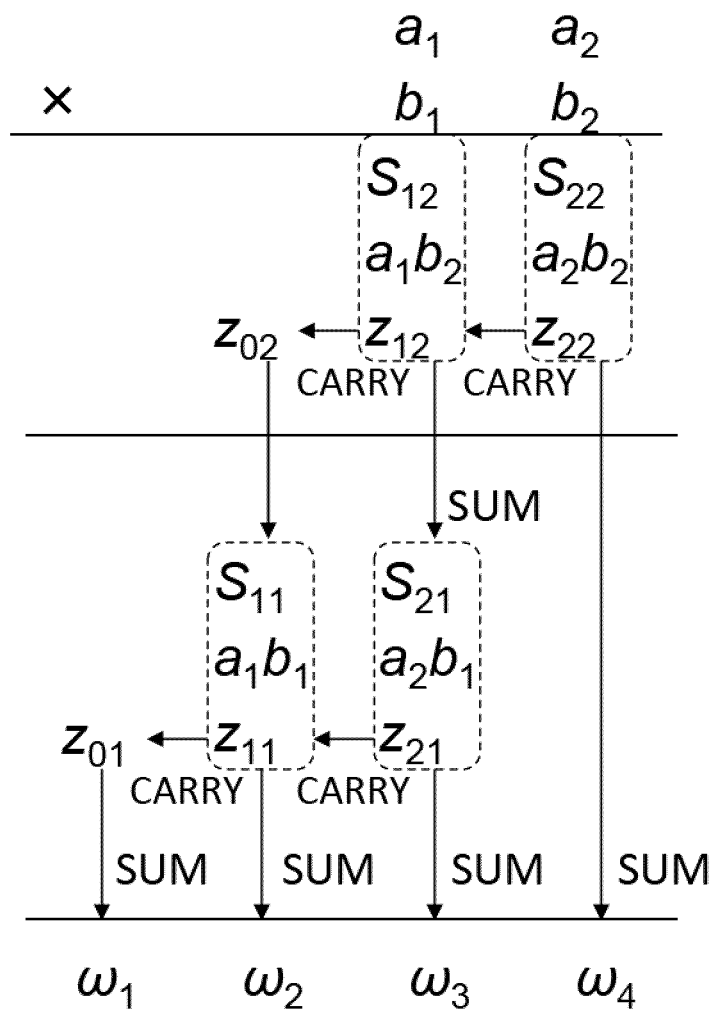
FIG. 1 is a diagram for describing an exemplary configuration of an energy function.

An overview of an embodiment is briefly described as follows.

(1) A semiconductor device including: a first memory cell; and a second memory cell that interacts with the first memory cell, in which storage content of the first memory cell and the second memory cell is stochastically inverted.

(2) The semiconductor device according to (1), in which the storage content is stochastically inverted by changing threshold voltages of the first memory cell and the second memory cell.

(3) The semiconductor device according to (1), further including first and second registers, in which a control voltage for controlling the threshold voltages of the first memory cell and the second memory cell is changed with passage of time, and when the control voltage reaches a condition designated by the first register, the control voltage is set to a voltage based on a value designated by the second register.

(4) The semiconductor device according to (3), in which the control voltage is a substrate bias.

(5) The semiconductor device according to (3), in which the control voltage is a power voltage.

(6) The semiconductor device according to (3), in which each of the first memory cell and the second memory cell includes a transistor for varying a trip point of the memory cell, and the control voltage is a voltage applied to a gate of the transistor.

(7) The semiconductor device according to any one of (1) to (6), further including first and second calculators, in which the first calculator is configured to calculate an energy function having the first memory cell and the second memory cell as an input, and the second calculator is configured to calculate an energy function having inverted values of the first memory cell and the second memory cell as an input.

(8) The semiconductor device according to any one of (1) to (7), in which each of the first memory cell and the second memory cell includes a word line, a first bit line, and a second bit line, the first bit line is able to perform reading and writing when the word line is activated, and the second bit line is constantly able to perform reading.

(9) The semiconductor device according to any one of (1) to (8), in which each of the first memory cell and the second memory cell is an SRAM memory cell including a pair of CMOS inverters.

(10) A semiconductor device including: a first memory cell; and a second memory cell that interacts with the first memory cell, in which each of the first memory cell and the second memory cell is an SRAM memory cell including a pair of CMOS inverters, and storage content of the first and second memory cells is stochastically inverted.

(11) The semiconductor device according to (10) further including: a first register that sets temperature and energy; a second register that sets temperature; and a third register that holds current temperature and current energy, in which applied voltages of the first and second memory cells are changed with passage of time, and when content of the third register reaches a condition designated by the first register, a substrate bias is set to a voltage based on the temperature designated by the second register.

(12) The semiconductor device according to (10) or (11), further including first and second calculators, in which the first calculator is configured to calculate an energy function having the first memory cell and the second memory cell as an input, and the second calculator is configured to calculate an energy function having inverted values of the first memory cell and the second memory cell as an input.

(13) The semiconductor device according to any one of (10) to (12), in which each of the first memory cell and the second memory cell includes a word line, a first bit line, and a second bit line, the first bit line is able to perform reading and writing when the word line is activated, and the second bit line is constantly able to perform reading.

(14) The semiconductor device according to any one of (10) to (13), in which substrate biases of the first and second memory cells are controlled, and the storage content is stochastically inverted by dropping threshold voltages of the first and second memory cells.

A semiconductor device according to an embodiment can be manufactured through a process of a complementary metal oxide semiconductor (CMOS) integrated circuit (IC) which is now widely being used. Thus, it is possible to easily manufacture a device that obtains a ground state of an Ising model.

Further, a semiconductor device according to an embodiment can be configured with a smaller number of hardware resources than when a ground state of an Ising model is obtained through a Neumann-type computer similarly manufactured through the process of the CMOS IC.

Hereinafter, exemplary embodiments will be described with reference to the appended drawings. In the drawing for describing embodiments, elements having the same function are denoted by the same reference numeral, and a duplicated description will be omitted.

In an embodiment, a problem to be factorized will be described as an example, but embodiments are not limited thereto as long as it is an NP-hard problem capable of obtaining a ground state of an Ising model.

First Embodiment

The present embodiment will be described in connection with an example of a semiconductor device that obtains a ground state of an Ising model. In the present embodiment, factorization is described as an example of a problem to be solved. Specifically, a problem in which a 4-bit number is factorized into two 2-bit values is converted into a problem for obtaining a ground state of an Ising model, and the problem is solved by a semiconductor device.

<Conversion of Problem that is Desired to be Solved into Ising Model>

Obtaining the ground state of the Ising model is an optimization problem that obtains an arrangement of spins minimizing the energy function of the Ising model. Thus, first, factorization is formulated as an optimization problem. When a number to be factorized is N, and factors of N are a and b, factorization can be performed by obtaining a and b satisfying the following Formula (1):

[Expression 1]

$$(N-ab)^2 = 0 \qquad (1)$$

Then, Formula (1) is expressed by a Hamiltonian (an energy function) of the Ising model. The energy function of the Ising model is commonly indicated by the following Formula (2). Further, $\sigma_i$ and $\sigma_j$ indicate values of an i-th site and a j-th site, $J_{i,j}$ indicates an interaction coefficient between the i-th site and the j-th site, $H_i$ indicates an external magnetic field coefficient for the i-th site, $<i,j>$ indicates a combination of two neighboring sites, and $\sigma$ indicates an arrangement of sites.

[Expression 2]

$$E(\sigma) = -\sum_{\langle i,j \rangle} J_{ij}\sigma_i\sigma_j - \sum_i H_i\sigma_i \qquad (2)$$

Each site $\sigma_i$ is a spin having two values of +1 and −1. Thus, the variables a and b of Formula (1) are preferably expressed by a combination of a plurality of spins having two values. As will be described later, in the present embodiment, since a storage element such as a flip flop expressed by a CMOS circuit rather than a spin is used as a site, each site $\sigma_i$ is hereinbelow assumed to have two values of 0 and 1. Since a problem to be solved is 6=2×3, if two bits are used in order to express each of the factors a and b such as sites $a_1$, $a_2$, $b_1$, and $b_2$ are set, the factorization can be performed by obtaining $a_1$, $a_2$, $b_1$, and $b_2$ by which the energy function indicated by the following Formula (3) is minimized.

[Expression 3]

$$E(a_1,a_2,b_1,b_2)=[N-(2a_1+a_2)(2b_1+b_2)]^2 \quad (3)$$

When Formula (3) is expanded, the interaction coefficient and the external magnetic field coefficient configuring Formula (2) are obtained. However, in Formula (2), the extent of the interaction is merely between two bodies, whereas when Formula (3) is expanded, an interaction among three bodies or four bodies is derived. Thus, since it is difficult to convert the problem into the Ising model in this state, a method disclosed in the following technical literature is used to derive only a two-body interaction.

TECHNICAL LITERATURE

Gernot Schaller and Ralf Schutzhold, The role of symmetries in adiabatic quantum algorithms, arXiv:0708.1882, 2009.

Figure 2:
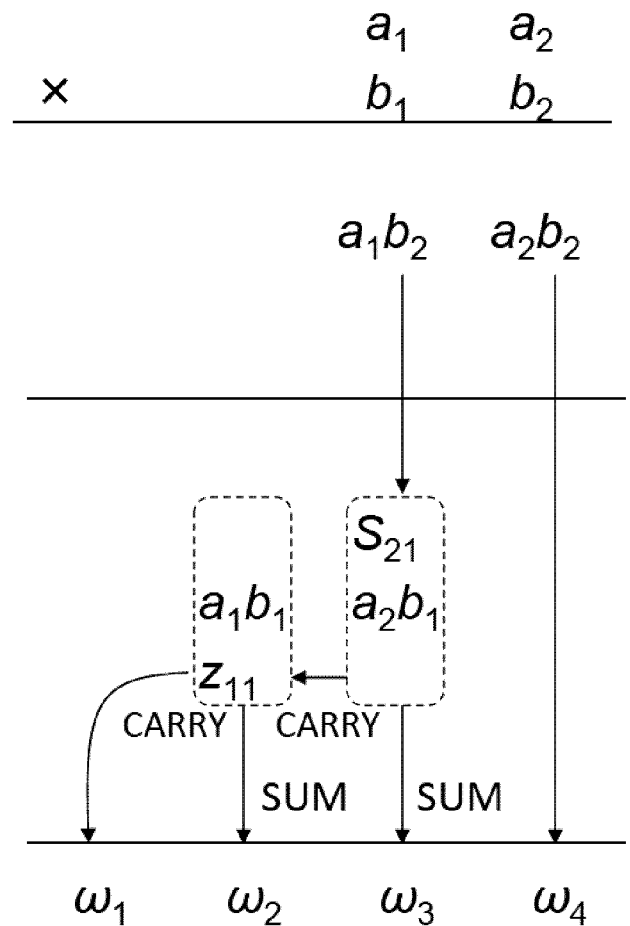
FIG. 2 is a diagram for describing an exemplary configuration of an energy function.

FIG. 1 illustrates the energy function of Formula (3) which is expressed by introducing auxiliary bits. The number N to be factorized is expressed by 4 bits $\omega_1$, $\omega_2$, $\omega_3$, and $\omega_4$. As the auxiliary bits, $S_{11}$, $S_{12}$, $S_{21}$, $S_{22}$, $z_{01}$, $z_{02}$, $z_{11}$, $z_{12}$, $z_{21}$, and $z_{22}$ are introduced. Here, since some auxiliary bits obviously become 0 (zero), an energy function simplified by excluding such auxiliary bits is illustrated in FIG. 2. As a result, the following Formulas (4) to (7) are obtained, corresponding to the four bits $\omega_1$, $\omega_2$, $\omega_3$, and $\omega_4$.

[Expression 4]

$$a_2 b_2 - \omega_4 = 0 \quad (4)$$

[Expression 5]

$$a_1 b_2 - S_{21} = 0 \quad (5)$$

[Expression 6]

$$a_2 b_1 + S_{21} - \omega_3 - 2z_{11} = 0 \quad (6)$$

[Expression 7]

$$a_1 b_1 + z_{11} - \omega_2 - 2\omega_1 = 0 \quad (7)$$

However, when an attempt to obtain the energy function by squaring each of Formulas (4) to (7) is made, a three- or more-body interaction is derived, and it is not converted into the Ising model, similarly to the example of Formula (3). In this regard, a method disclosed in Non-Patent Literature 1 is used. Bit variables a, b, c, $c_1$, $c_2$, $c_3$, $c_4$, ..., and $c_n$ of two values (0 and 1) are identical to bit variables a, b, $c_1$, $c_2$, $c_3$, $c_4$, ..., and $c_n$ that satisfy the following Formulas (8) and (9) when there are integer coefficients $k_1$, $k_2$, $k_3$, $k_4$, ..., and $k_n$ for $c_1$, $c_2$, $c_3$, $c_4$, ..., and $c_n$. In other words, approximate expressions that become 0 (zero) in the same condition are obtained.

[Expression 8]

$$(ab+k_1 c_1+k_2 c_2+k_3 c_3+k_4 c_4+\ldots+k_n c_n)^2=0 \quad (8)$$

[Expression 9]

$$2[\tfrac{1}{2}(a+b-\tfrac{1}{2})+k_1 c_1+k_2 c_2+k_3 c_3+k_4 c_4+\ldots+k_n c_n]^2-\tfrac{1}{8}=0 \quad (9)$$

In Formula (9), a term of ab is converted into a term of a+b, and thus it falls within the range of the interaction between two bodies. The following Formulas (10) to (13) are obtained by applying this conversion to Formulas (4) to (7).

[Expression 10]

$$2[\tfrac{1}{2}(a_1+b_2-\tfrac{1}{2})-\omega_4]^2-\tfrac{1}{8}=a_2 b_2-2a_2\omega_4-2b_2\omega_4+3\omega_4 \quad (10)$$

[Expression 11]

$$2[\tfrac{1}{2}(a_1+b_2-\tfrac{1}{2})-S_{21}]^2-\tfrac{1}{8}=a_1 b_2-2a_1 S_{21}-2b_2 S_{21}+3S_{21} \quad (11)$$

[Expression 12]

$$2[\tfrac{1}{2}(a_2+b_1-\tfrac{1}{2})+S_{21}-\omega_3-2z_{11}]^2-\tfrac{1}{8}=a_2 b_1+2a_2 S_{21}+2b_1 S_{21}+S_{21}-2a_2\omega_3-2b_1\omega_3-4S_{21}\omega_3+3\omega_3-4a_2 z_{11}-4b_1 z_{11}-8\omega_3 z_{11}+10z_{11} \quad (12)$$

[Expression 13]

$$2[\tfrac{1}{2}(a_1+b_1-\tfrac{1}{2})+z_{11}-\omega_2-2\omega_1]^2-\tfrac{1}{8}=a_1 b_1-4a_1\omega_1-4b_1\omega_1+10\omega_1-2a_1\omega_2-2b_1\omega_2+8\omega_1\omega_2+3\omega_2+2a_1 z_{11}+2b_1 z_{11}-8\omega_1 z_{11}-4\omega_2 z_{11}+z_{11} \quad (13)$$

The terms obtained in Formulas (10) to (13) are brought together into an energy function indicated by the following Formula (14). Further, $a_1=\sigma_1$, $a_2=\sigma_2$, $b_1=\sigma_3$, $b_2=\sigma_4$, $z_{11}=\sigma_5$, and $S_{21}=\sigma_6$ came assumed.

[Expression 14]

$$E(\sigma) = \sum_{\langle i,j \rangle} J_{ij}\sigma_i\sigma_j + \sum_i H_i\sigma_i + \text{Offset} \quad (14)$$

$$J_{ij} = \begin{pmatrix} 0 & 0 & 1 & 1 & 2 & -2 \\ 0 & 0 & 1 & 1 & -4 & 2 \\ 0 & 0 & 0 & 0 & -2 & 2 \\ 0 & 0 & 0 & 0 & 0 & -2 \\ 0 & 0 & 0 & 0 & 0 & -8 \\ 0 & 0 & 0 & 0 & 0 & 0 \end{pmatrix}$$

$$H_i = \begin{pmatrix} -4\omega_1 - 2\omega_2 \\ -2\omega_3 - 2\omega_4 \\ -4\omega_1 - 2\omega_2 - 2\omega_3 \\ -2\omega_4 \\ -8\omega_1 - 4\omega_2 + 8\omega_3 + 11 \\ -4\omega_3 + 4 \end{pmatrix}$$

Offset = $8\omega_1\omega_2 + 10\omega_1 + 3\omega_2 + 3\omega_3 + 3\omega_4$

Thus, in the present embodiment, a semiconductor device that obtains the ground state of the Ising model corresponding to an energy function $E(\sigma)$ indicated by Formula (14) when $\omega_1$, $\omega_2$, $\omega_3$, and $\omega_4$ in which the number N to be factorized is expressed by four bits are given, that is, $\sigma=\{\sigma_1, \sigma_2, \sigma_3, \sigma_4, \sigma_5, \sigma_6\}$ in which $E(\sigma)$ is 0 is described.

<Semiconductor Device that Obtains Ground State of Ising Model>

Figure 3:
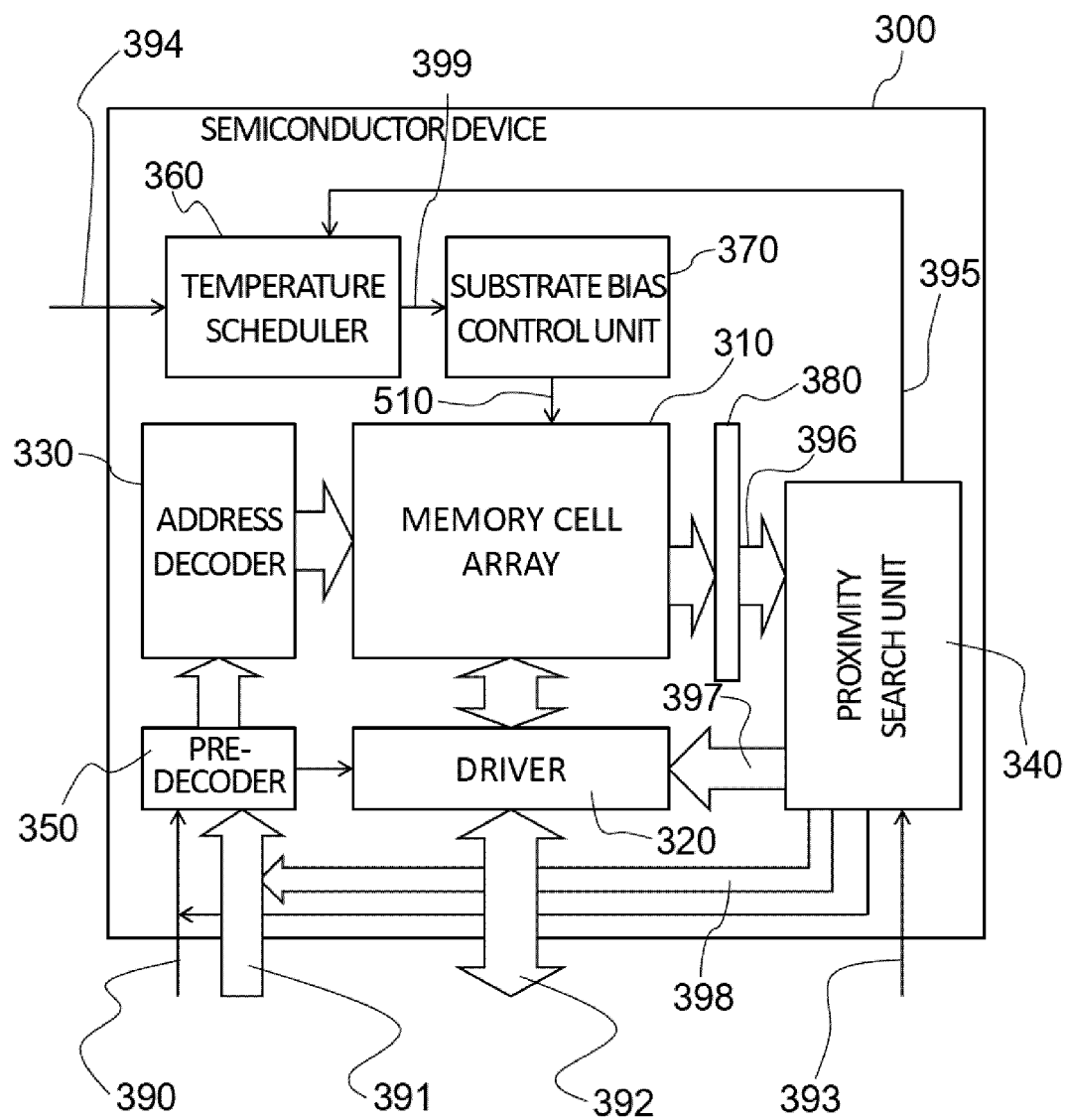
FIG. 3 is a diagram for describing a configuration of a semiconductor device that obtains a ground state of an Ising model according to a first embodiment.

FIG. 3 is a configuration diagram of the semiconductor device according to a first embodiment. A semiconductor device 300 according to the present embodiment has a structure based on a static random access memory (SRAM). A memory cell array 310, a driver 320, an address decoder 330, a pre-decoder 350, a sense amplifier 380, a request line 390, an address line 391, and a data line 392 follow corresponding components in an SRAM. The semiconductor device 300 is manufactured through a process of a CMOS IC. A difference with an SRAM will be described in detail in a description of each component.

The site of the Ising model, that is, σ in Formula (14) is expressed by the memory cell array 310. Thus, in the example of Formula (14), the memory cell array 310 is a memory cell array having a 6- or more-bit memory cell.

(Same Configuration as in SRAM)

The memory cell array 310 is a configuration in which reading and writing can be performed by designating an address from the outside, similarly to the SRAM. For example, in an 8-word configuration in which a word is 8 bits, it is assumed that the memory cell array 310 is a 64-bit memory cell array in total, and can perform reading and writing by one word and 8 bits for each address. To this end, the semiconductor device 300 includes the address decoder 330 that activate word lines of the memory cell array 310, the driver 320 that drives or reads bit lines in the memory cell array 310, and the pre-decoder 350 that generates a control signal. The driver 320 is configured with a sense amplifier used for reading and a write driver used for writing.

Figure 5:
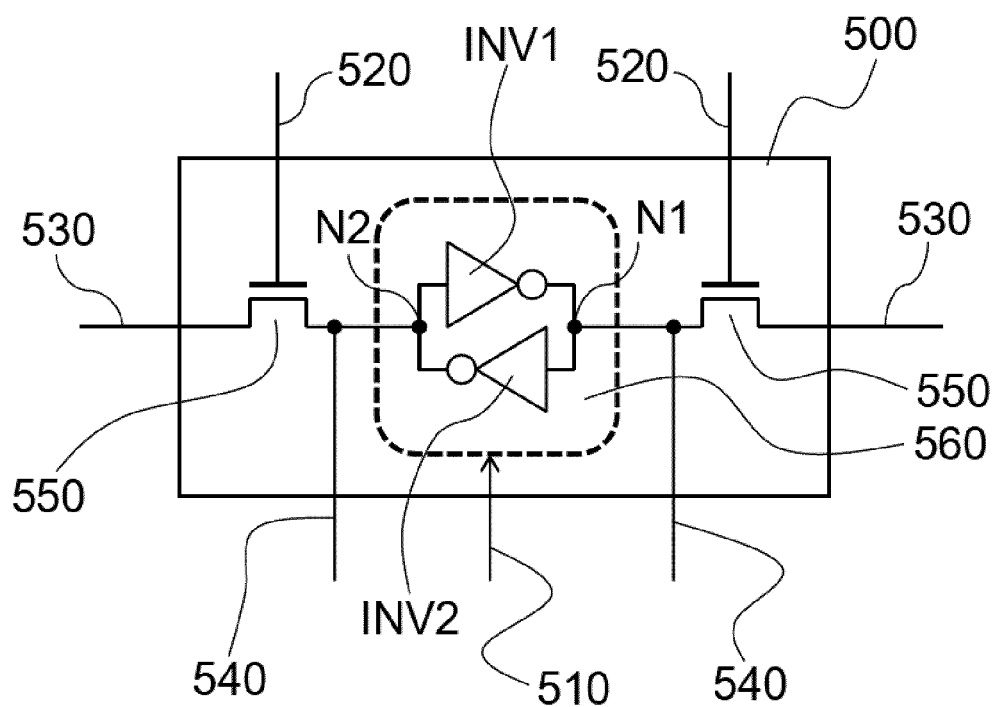
FIG. 5 is a diagram for describing a configuration of a memory cell according to the first embodiment.
Figure 5:
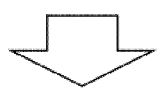
Figure 5:
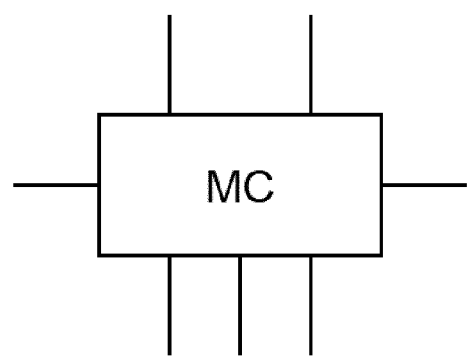
Figure 6:
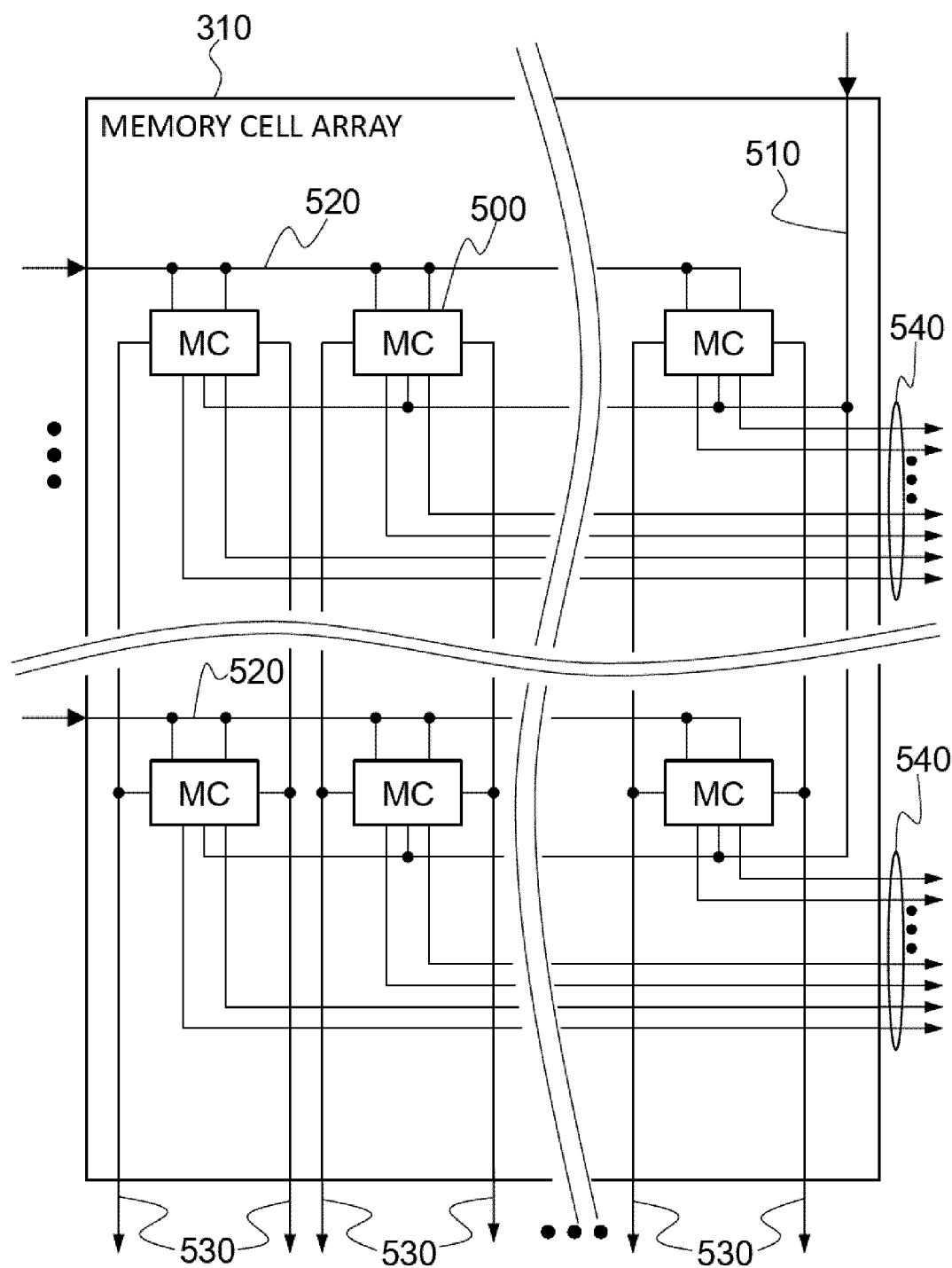
FIG. 6 is a diagram for describing a configuration of a memory cell array according to the first embodiment.

A structure of the memory cell array 310 will be described with reference to FIGS. 5 and 6. FIG. 5 is a diagram for describing a configuration of a memory cell according to the first embodiment. FIG. 6 is a diagram for describing a configuration of a memory cell array according to the first embodiment. The memory cell array 310 includes memory cells 500 of FIG. 5 which are arranged as illustrated in FIG. 6. The memory cell 500 is configured with a data holding unit 560 and a pair of pass gate transistors 550, and includes a pair of word lines 520, a pair of first bit lines 530, a pair of second bit lines 540, and a substrate bias control line 510 as an interface with the outside. The data holding unit 560 is configured with two CMOS inverters. A flip flop is configured such that an output of a CMOS inverter INV1 is connected to an input of a CMOS inverter INV2 through a node N1, and an output of the CMOS inverter INV2 is connected to an input of the CMOS inverter INV1 through a node N2. The node N1 and the node N2 are complementary storage nodes. The pass gate transistor 550 is configured with an n-channel. MOS transistor.

Controlling input and output of the data holding unit 560 through the pass gate transistor 550 and the word line 520 serving as the control signal on the pass gate transistor 550 and performing reading and writing through the first bit line 530 are the same as in the SRAM. The address decoder 330 drives the word line 520, and the driver 320 drives the first bit line 530.

One of features of the present embodiment lies in that the substrate bias control line 510 that performs substrate bias control on the data holding unit 560 is provided, and the second bit line 540 is provided to read storage content of the data holding unit 560, separately from the first bit line 530.

In the memory cell array 310 of FIG. 6, the first bit line 530 is installed in order to input and output one word, and the word is selected by the word line 520. In addition, the second bit line 540 is output to the outside individually from each memory cell 500. In other words, another features lies in that the memory cell array 310 is configured to be able to perform reading of all bits in parallel, separately from reading and writing in units of words. Further, it is possible to control the substrate biases of the data holding units 560 of all the memory cells 500 included in the memory cell array 310 from the outside. In the present embodiment, the data holding unit 560 is connected directly to the second bit line 540, but a configuration of a so-called dual port SRAM in which the data holding unit 560 is connected to the second bit line 540 through the pass gate transistor, similarly to the first bit line 530 may be provided. When there are many memory cells, the configuration of the dual port SRAM is effective.

(Different Configuration from SRAM)

The semiconductor device 300 further includes a proximity search unit 340, a temperature scheduler 360, and a substrate bias control unit 370, unlike the SRAM.

As a solution of an optimization problem for obtaining the ground state of the Ising model or the like, an algorithm called simulated annealing is used on the Neumann-type computer of the related art. The simulated annealing is configured with three elements, that is, a proximity search, a metropolis technique, and a temperature scheduling.

The proximity search is a technique of calculating energy of a state nearby a current state and causing the state to transition to the nearby state when the energy is reduced. It is possible to face a state in which energy is reduced, that is, a state close to an optimum solution by repeating the proximity search, but when it is caught in a local solution, it is difficult to escape it.

In this regard, the metropolis technique is introduced in order to escape from the local solution. In the metropolis technique, escape from the local solution is performed by stochastically permitting transition to a state in which energy is increased in the proximity search. A rate at which transition is permitted is decided by a difference between temperature and energy, and transition is permitted at a probability indicated by Formula (15) when temperature is T, energy in a current state is $E_{current}$, and energy in a nearby state is $E_{next}$.

[Expression 15]

$$P = \exp\left(-\frac{E_{next} - E_{current}}{T}\right) \tag{15}$$

Further, since it does not converge at all in a state in which the temperature is constant, the temperature scheduling of gradually decreasing the temperature is necessary.

The simulated annealing is an algorithm executed by the Neumann-type computer and assumed to be sequentially executed. However, in the present embodiment, in order to search for the ground state of the Ising model at a high speed through the semiconductor device 300, an operation of the simulated annealing is modified so that the proximity search unit 340, the temperature scheduler 360, and the substrate bias control unit 370 are simultaneously operated in parallel.

(a) Proximity Search

Figure 4:
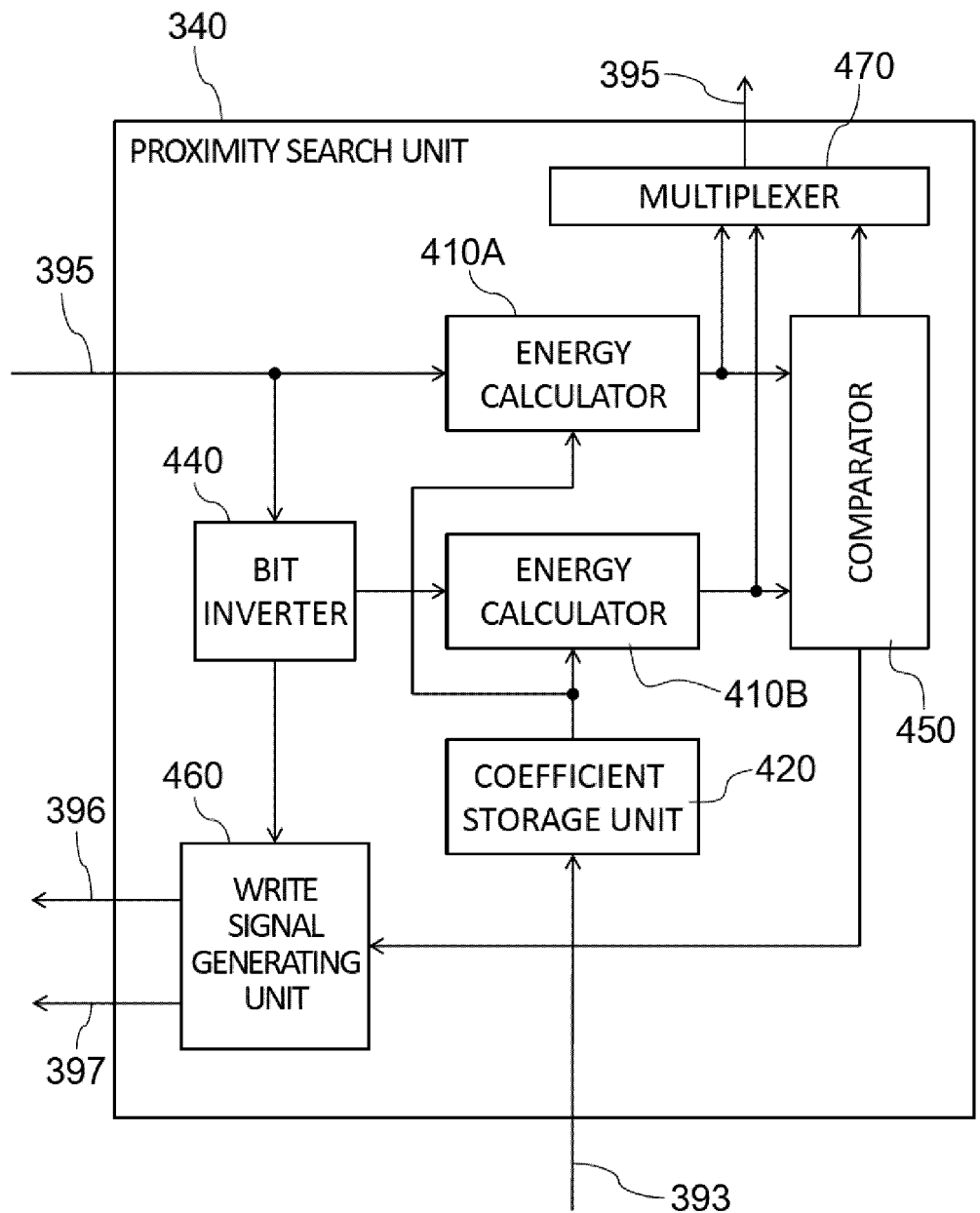
FIG. 4 is a diagram for describing a configuration of a proximity search unit according to the first embodiment.

FIG. 4 illustrates a configuration of the proximity search unit 340. The proximity search unit 340 is configured with two energy calculators 410A and 410B, a coefficient storage unit 420, a bit inverter 440, a comparator 450, and a write signal generating unit 460.

In the semiconductor device 300, the proximity search is performed as follows. First, the sense amplifier 380 reads all bits from the second bit lines 540 of the memory cell array 310. Hereinafter, a read bit sequence is referred to as a "current state vector." The current state vector is input to the energy calculator (first calculator) 410A via a signal line 395, and the current state vector is input to the bit inverter 440. The bit inverter 440 generates a bit by inverting one bit which is randomly selected among the input bit sequence (the current state vector). It is referred to as a "nearby state vector." The nearby state vector generated by the bit inverter 440 is input to the energy calculator (second calculator) 410B. The bit inverter 440 transfers an identifier (bit number) indicating the inverted bit to the write signal generating unit 460.

The energy calculators 410A and 410B are calculators having the same structure, and calculate the energy function $E(\sigma)$ indicated by Formula (14). At this time, $\sigma$ which is as a parameter of the energy function $E(\sigma)$ is the bit sequence (the current state vector in the case of the energy calculator 410A and the nearby state vector in the case of the energy calculator 410B) input to the energy calculators 410A and 410B. $J_{ij}$, $H_i$, and Offset which are parameters necessary in calculating the energy function $E(\sigma)$ are held in the coefficient storage unit 420.

The coefficient storage unit 420 is a storage device for setting parameters necessary in calculating the energy function from the outside through a coefficient setting interface 393 serving as an interface between the semiconductor device 300 and the outside and holding the set parameters.

The comparator 450 compares the energy calculated by the energy calculator 410A with the energy calculated by the energy calculator 410B, and determines the smaller energy. A determination result is input to the write signal generating unit 460.

The energy calculators 410A and 410B and the comparator 450 may be configured with a digital circuit or an analog circuit.

The write signal generating unit 460 generates a signal for updating content stored in the memory cell array 310 from the current storage content (the current state vector) to the nearby state vector when the energy of the nearby state vector is smaller. Specifically, the write signal generating unit 460 extracts one word including the inverted bit in the current state vector based on the bit number designated from the bit inverter 440, and generates one word in which the bit is inverted in the word and an address for writing the word in the memory cell array 310. The generated word is input to the driver 320 via a signal line 397, the address is input to the pre-decoder 350 via a signal line 398, and a write request signal is input to the pre-decoder 350 via the request line 390.

Through this operation, the proximity search unit 340 can implement the operation corresponding to the proximity search in the simulated annealing at a high speed.

A multiplexer 470 transfers energy of a next state vector (either of the current state vector and the nearby state vector which has smaller energy) based on a comparison result of the comparator 450 to the temperature scheduler 360 which will be described later via the signal line 395.

Next, the substrate bias control unit 370 that implements an operation corresponding to the metropolis technique and the temperature scheduler 360 corresponding to the temperature schedule will be described.

(b) Metropolis Technique

In the simulated annealing, the metropolis technique is a technique of deciding transition to a state having high energy in the proximity search at the probability indicated by Formula (15). However, in this technique, it is difficult to perform a simultaneous parallel operation through hardware independent of the proximity search. Further, since it is necessary to generate a large number of random numbers in order to perform a stochastic operation, the coast cost for implementing the simulated annealing is increased.

In this regard, in the semiconductor device 300, instead of the metropolis technique, the escape from the local solution is implemented by inverting storage content of the memory cells in the memory cell array 310 at a predetermined probability, that is, causing the memory cells to enter an unstable state. At this time, the probability at which the storage content is inverted is decided by only temperature regardless of the difference between the energy of the current state vector and the energy of the nearby state vector, unlike the metropolis technique.

Further, when energy is not decreased in light of history of the energy calculated by the energy calculators 410A and 410B, it is determined to be caught in the local solution, and at this time, the escape from the local solution is attempted by stochastically inverting the storage content of the memory cells.

As a technique of causing the memory cells to enter the unstable state and inverting stochastically the storage content thereof, threshold voltages (Vth) of the memory cells are changed. As a technique of changing the threshold voltage, for example, substrate bias control, power voltage control, or trip point control can be used. In the present embodiment, the substrate bias control is used.

In the substrate bias control, the substrate bias control unit 370 applies substrate bias to the substrate bias control line 510 of each of the memory cells in the memory cell array 310.

Commonly, the substrate bias control is used to compensating a variation when a semiconductor device is manufactured or for reducing a leak current at the time of standby. Specifically, when the substrate bias control is used for reducing a leak current at the time of standby, during a normal operation, a transistor operates at a low threshold voltage (Vth) without applying a substrate bias. On the other hand, during a standby operation, a leak current is reduced by applying a reverse substrate bias and increasing the threshold voltage (Vth). Alternatively, the threshold voltage (Vth) is normally set to a level at which the occurrence of a leak current can be suppressed, and at the time of operation, the threshold voltage (Vth) is decreased by applying the forward substrate bias. Unlike this substrate bias utilization method, in the present embodiment, the threshold voltage (Vth) is intentionally decreased by the substrate bias to cause the memory cell to enter the unstable state. Commonly, in order to hold data, the threshold voltage (Vth) of the data holding unit 560 is set to a high level at which it is not influenced by noise. However, in the present embodiment, content of the memory cell is stochastically inverted by decreasing the threshold voltage (Vth) so that it is intentionally influenced by noise. The inversion probability is adjusted by the threshold voltage (Vth). Further, a noise source may be arranged nearby the memory cell, and the probability may be controlled by both strength of the noise source and the threshold voltage (Vth).

Accordingly, in the present embodiment, it is possible to implement the operation corresponding to the metropolis technique through the substrate bias control. Commonly, since it is necessary to generate a large number of random numbers in order to implement the metropolis technique, it is necessary to use a random number generator many times or to prepare a number of random number generators. On the other hand, in the present embodiment, the problem is solved by directly using instability of the memory cell occurring by decreasing the substrate bias.

(c) Temperature Scheduling

Figure 7:
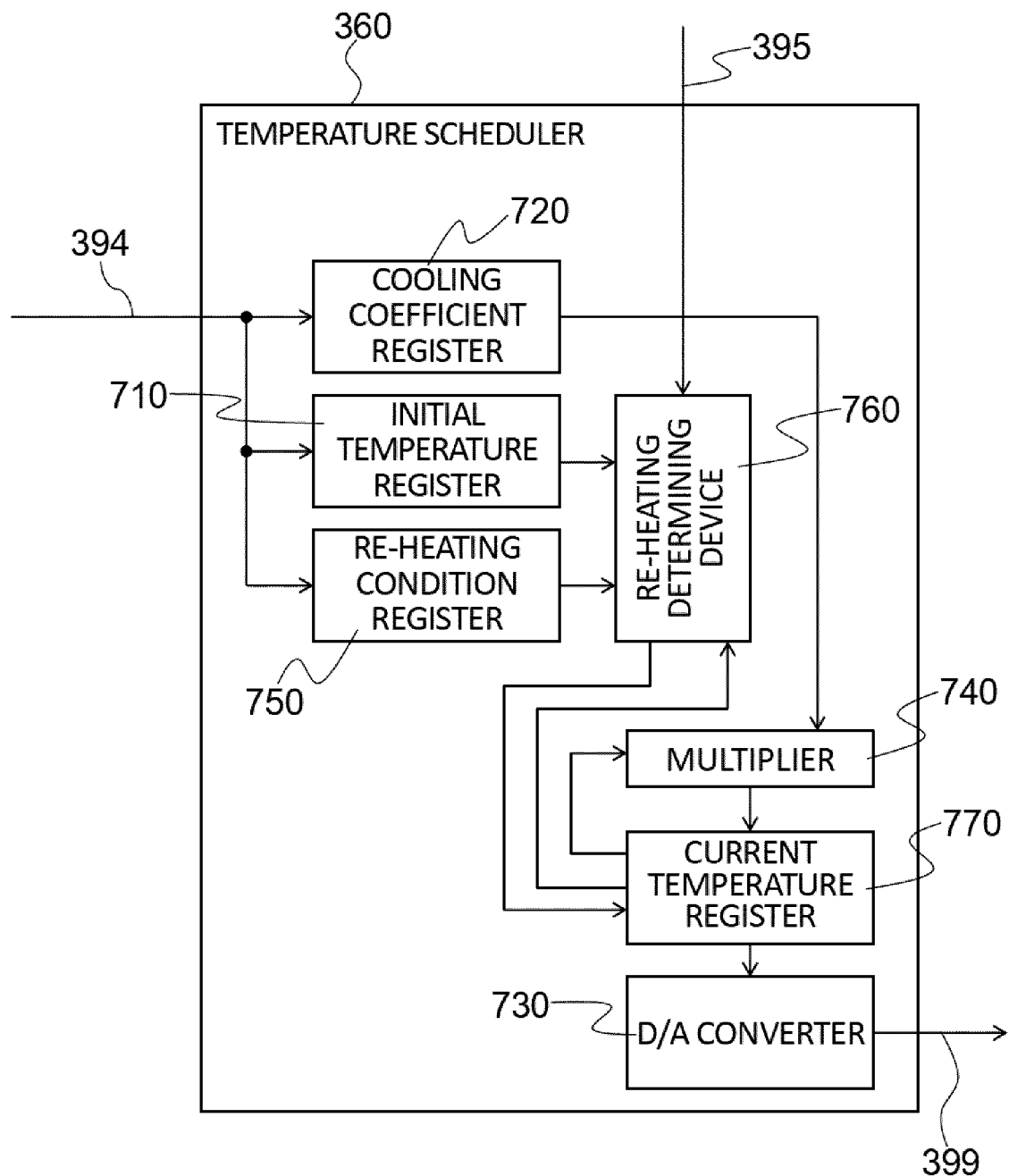
FIG. 7 is a diagram for describing a configuration of a temperature scheduler according to the first embodiment.

The substrate bias is chronologically changed according to the voltage generated by the temperature scheduler 360. A configuration of the temperature scheduler 360 will be described with reference to FIG. 7. FIG. 7 is a diagram for describing a configuration of the temperature scheduler according to the first embodiment. The temperature scheduler 360 is configured with an initial temperature register 710 (a second register), a cooling coefficient register (a fourth register) 720, a D/A converter 730, a multiplier 740, a re-heating condition register 750 (a first register), a re-heating determining device 760, and a current temperature register (a third register) 770.

The initial temperature register 710, the cooling coefficient register 720, and the re-heating condition register 750 are set through a temperature setting interface 394 serving as an interface between the semiconductor device 300 and the outside. The initial temperature register 710 is a register for storing an initial temperature in the temperature schedule and an initial temperature when re-heating is performed, and sets a value from the outside and holds the set value. The cooling coefficient register 720 sets a coefficient for cooling the temperature. In the temperature schedule, a geometric cooling technique of performing cooling by multiplying the current temperature by a coefficient (<1) held in the cooling coefficient register 720 is used. The re-heating condition register 750 sets a condition for performing heating again and promoting convergence to the solution when cooling progresses but content of the memory cell array 310 does not reach the solution. Specifically, the re-heating condition register 750 sets temperature and energy serving as a condition for performing re-heating.

The current temperature register 770 is initialized according to content set to the initial temperature register 710, and the multiplier 740 multiplies a value of the current temperature register 770 by a value of the cooling coefficient register 720, and sets a multiplication value to the current temperature register 770, and thus a chronological change in the value of the current temperature register 770 conforms to the temperature schedule based on the geometric cooling technique. Then, the D/A converter 730 obtains a voltage used in the substrate bias control by converting the value of the current temperature register 770 into a voltage, and transfers the obtained voltage to the substrate bias control unit 370 via a signal line 399.

In the process of the temperature schedule, the re-heating determining device 760 acquires the energy from the proximity search unit 340 and the current state energy and the current temperature of the memory cell array 310 from the current temperature register 770 via the signal line 395. Then, re-heating condition energy and re-heating condition temperature held in the re-heating condition register 750 are compared with the current energy and the current temperature. When a condition such as (current energy>re-heating condition energy) Λ(current temperature<re-heating condition temperature) is satisfied, re-heating is performed. The re-heating is performed by storing the value of the initial temperature register 710 in the current temperature register 770.

Through the above configuration, the semiconductor device 300 can obtain the ground state of the Ising model having the coefficient set to the coefficient storage unit 420 through the coefficient setting interface 393. For example, the factorization can be performed by setting the coefficient $J_{ij}$, $H_i$, and Offset in Formula (14) and obtaining the ground state of the Ising model.

At this time, it is necessary to set parameters appropriate to the initial temperature register 710, the cooling coefficient register 720, and the re-heating condition register 750 through the temperature setting interface 394 according to complexity of the Ising model. Further, an initial value of a state to be stored in the memory cell array 310 can be set by writing it in the memory cell array 310 through the request line 390, the address line 391, and the data line 392, similarly to the SRAM. Then, after the ground state of the Ising model is obtained by the operations of the proximity search unit 340, the temperature scheduler 360, and the substrate bias control unit 370, the ground state of the Ising model can be acquired by reading it from the memory cell array 310, similarly to the SRAM.

Second Embodiment

Embodiment by Power Voltage Control of Memory Cell

Figure 10:
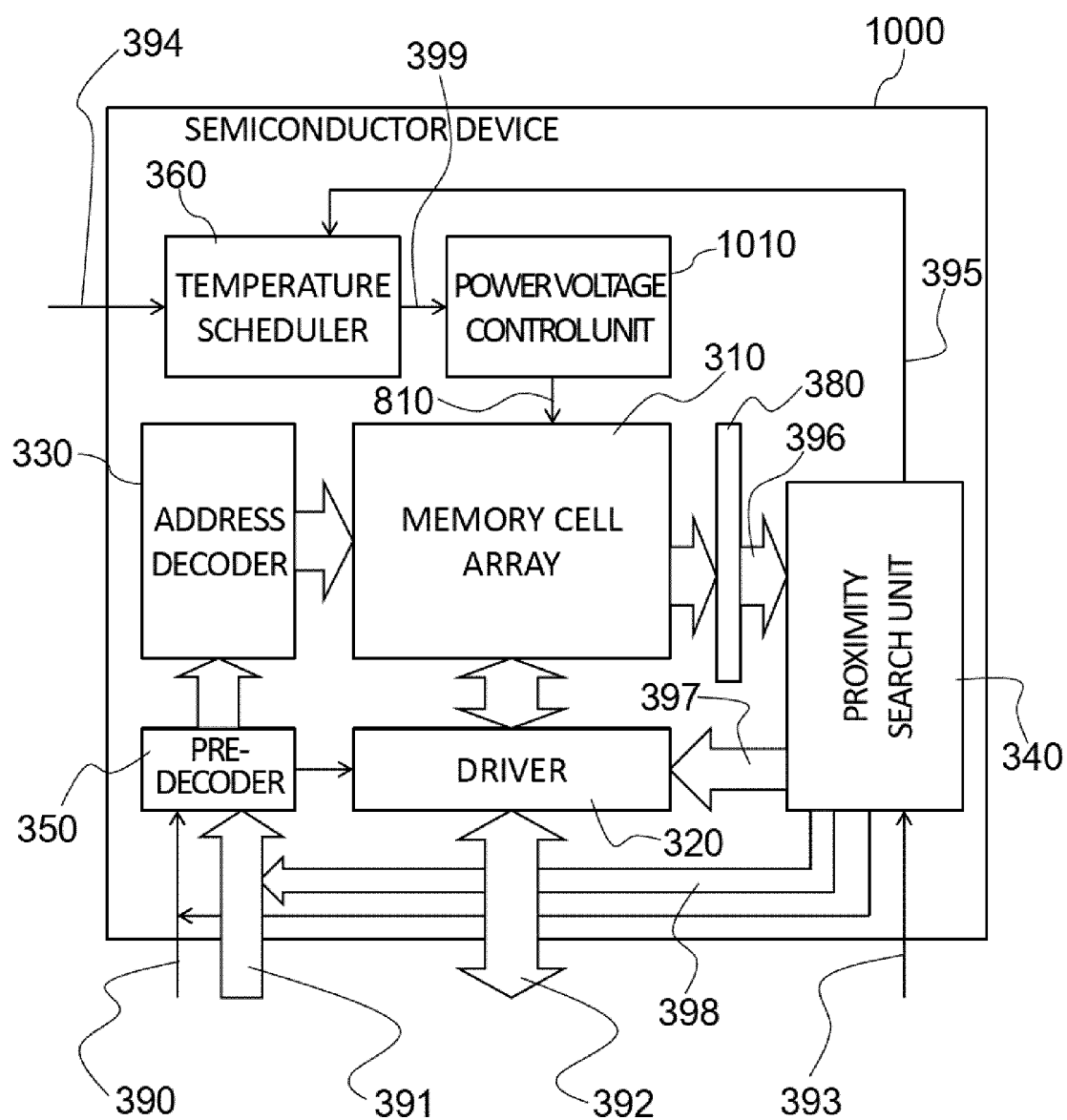
FIG. 10 is a diagram for describing a configuration of a semiconductor device that obtains a ground state of an Ising model according to the second embodiment.

FIG. 10 is a configuration diagram of a semiconductor device according to a second embodiment. A semiconductor device 1000 according to the present embodiment differs from the semiconductor device 300 according to the first embodiment in that power voltage of the memory cell is controlled such that the memory cell is stochastically inverted. The remaining points are the same as in the first embodiment, and thus a duplicated description is omitted.

Figure 8:
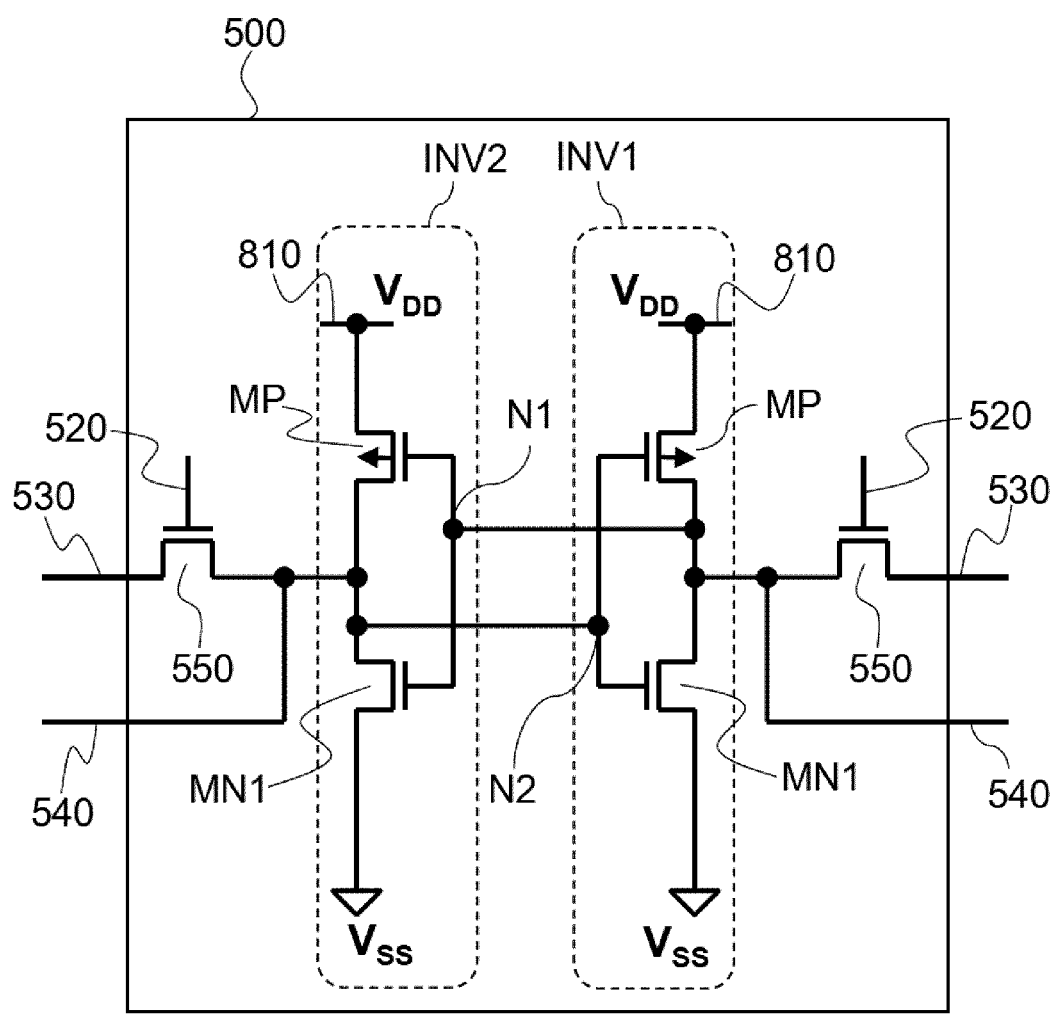
FIG. 8 is a diagram for describing a configuration of a memory cell according to a second embodiment.

In the semiconductor device 1000, a memory cell array 310 is configured with the same memory cells 500 as in the first embodiment as illustrated in FIG. 8. CMOS inverters INV1 and INV2 are configured with a p-channel MOS transistor MP and an n-channel MOS transistor MN1. It is possible to control the power voltage of the memory cell 500 by controlling a voltage ($V_{DD}$) supplied to a power line 810 of the memory cell 500. Commonly, a voltage of about 1 V is used as power voltage of the SRAM in order to reliably hold the storage. As a result, it is possible to a bit error rate (BER) of about $10^{-9}$. In this case, an error, that is, bit inversion occurs at a rate of one bit per Gbit.

Meanwhile, it is possible to invert the storage content of the memory cells by dropping the power voltage and thus intentionally making the BER worse, and the inversion degree is in proportion to a degree in which the voltage is lowered, that is, a degree in which the BER gets worse. Similarly to the first embodiment, the power voltage of the memory cell 500 is controlled according to scheduling based on temperature or using a state in which energy does not change as a trigger. In the present embodiment, a power voltage control unit 1010 controls the power line 810. At this time, a BER of about $10^{-1}$ can be obtained by dropping a voltage, for example, to about 0.6 V. In this case, an error, that is, bit inversion occurs at a rate of one bit per 10 bits. In the present embodiment, the escape from the local solution which is necessary for searching for the ground state of the Ising model can be implemented by comparing the power line 810 with a normal region (for example, about 1 V) using the power voltage control unit 1010 and dropping it to a voltage (for example, about 0.6 V) that is low and insufficient to hold the storage content accurately.

Third Embodiment

Embodiment by Trip Point Control of Memory Cell

Figure 11:
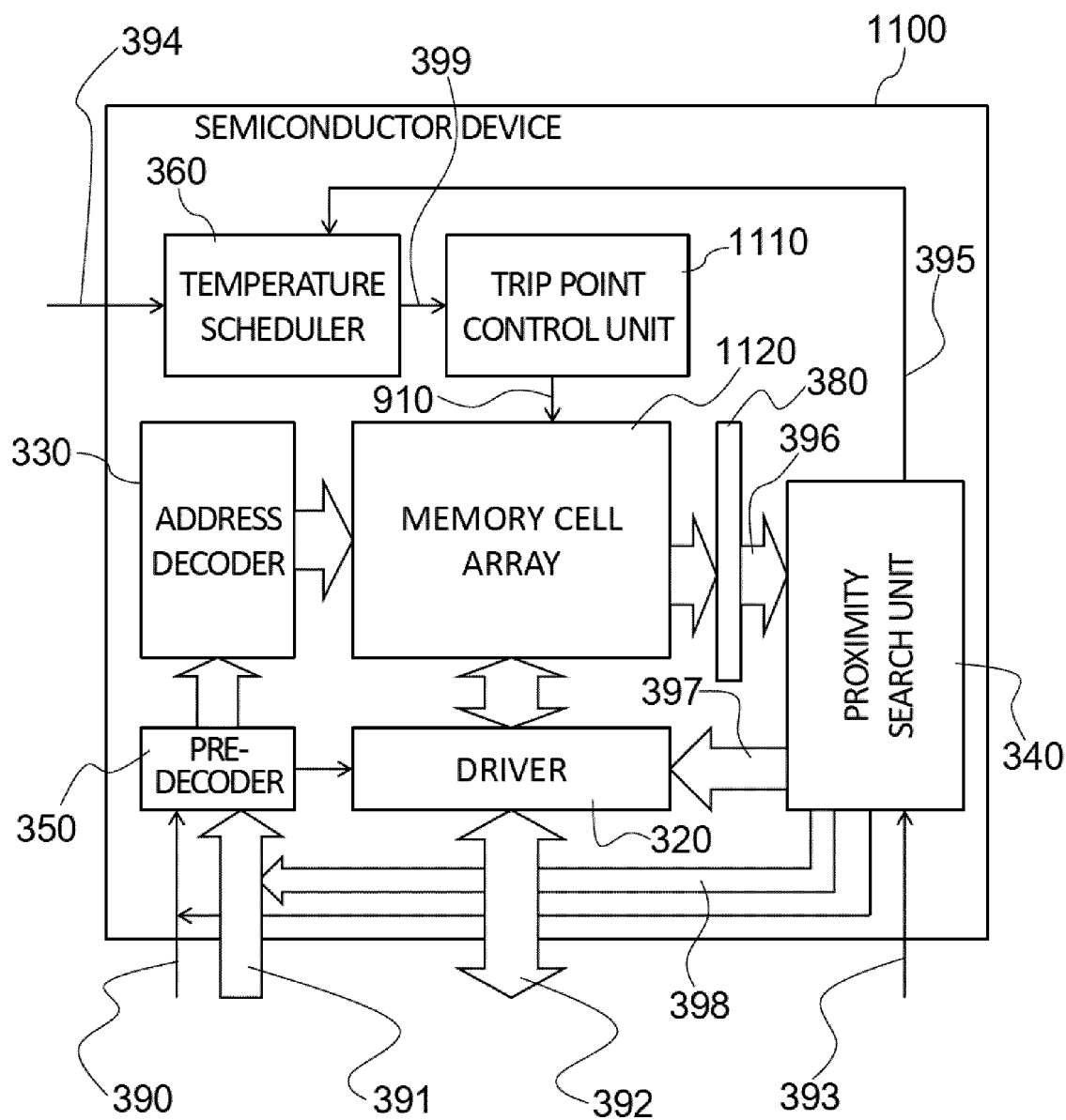
FIG. 11 is a diagram for describing a configuration of a semiconductor device that obtains a ground state of an Ising model according to the third embodiment.

FIG. 11 is a configuration example of a semiconductor device according to a third embodiment. A semiconductor device 1100 according to the present embodiment differs from the semiconductor device 300 according to the first embodiment and the semiconductor device 1000 according to the second embodiment in that a trip point (a voltage change point for causing the storage content to transition from 0 to 1 or from 1 to 0) of the memory cell is controlled in order to stochastically invert the memory cell. The remaining points are the same as in the first embodiment and the second embodiment, and thus a duplicated description is omitted.

Figure 9:
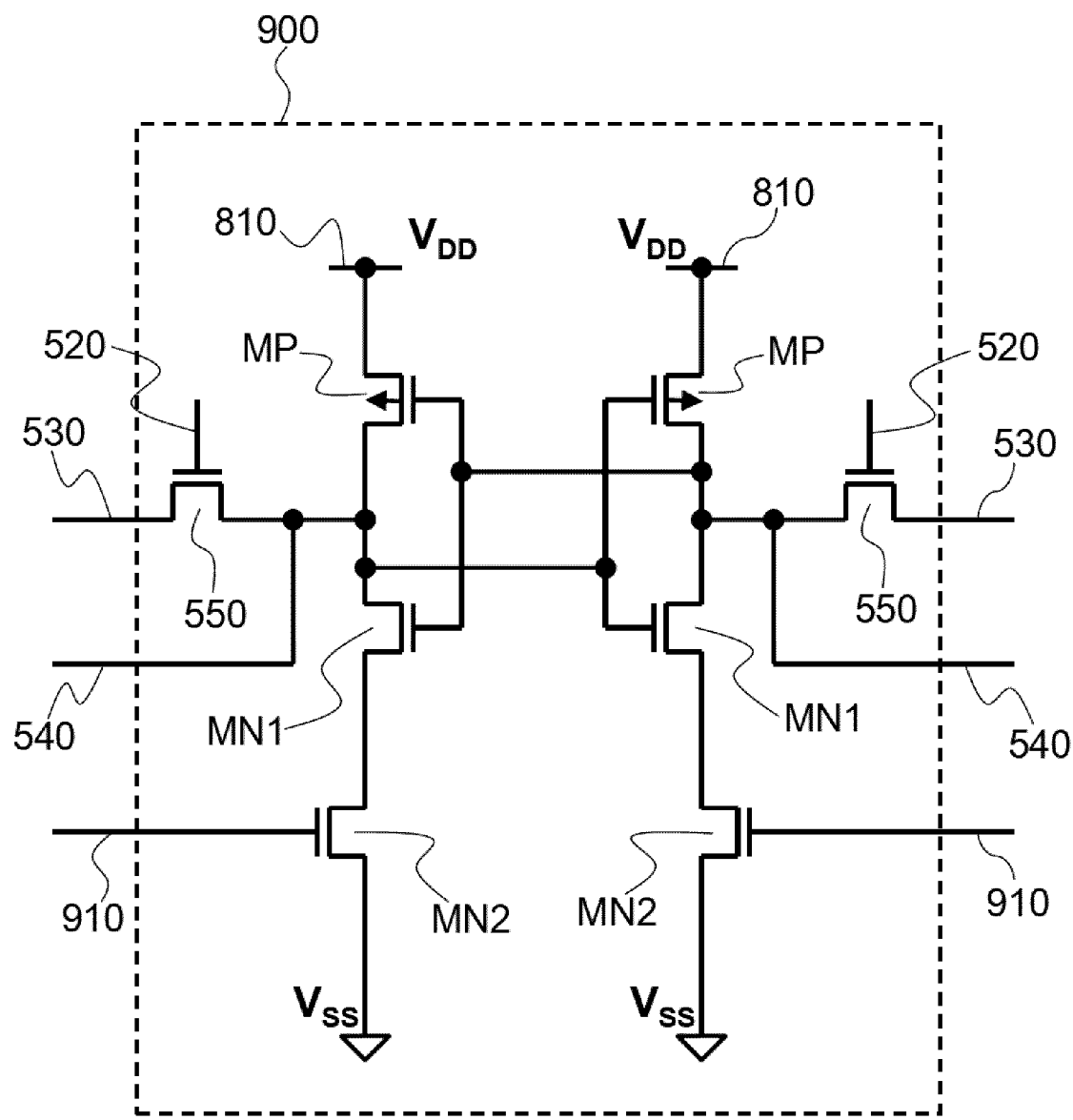
FIG. 9 is a diagram for describing a configuration of a memory cell according to a third embodiment.

In the semiconductor device 1100, a memory cell array 1120 is configured with memory cells 900 illustrated in FIG. 9. Compared to the memory cells 500 according to the first embodiment and the second embodiment, an n-channel MOS transistor MN2 that controls the trip point of the memory cell and a trip point control line 910 that controls the transistor MN2 are further provided. In other words, the CMOS inverter is configured with the p-channel MOS transistor MP, the n-channel MOS transistor MN1, and the n-channel MOS transistor MN2.

Similarly to the first embodiment and the second embodiment, in the present embodiment, when content of the memory cell is stochastically inverted (when it is detected that it is caught in the local solution from the state in which the temperature is high or the fact that the energy does not change), a voltage to be supplied to the trip point control line 910 is controlled by a trip point control unit 1110.

The invention made by the present inventor(s) has been specifically described based on the embodiments and the examples, but the present invention is not limited to the above embodiments and examples, and it is needless to say that various changes can be made.

REFERENCE SIGNS LIST 300, 1000, 1100 . . . Semiconductor device
310, 1120 . . . Memory cell array
320 . . . Driver
330 . . . Address decoder
340 . . . Proximity search
350 . . . Pre-decoder
360 . . . Temperature scheduler
370 . . . Substrate bias control unit
380 . . . Sense amplifier
390 . . . Request line
391 . . . . Address line
392 . . . Data line
393 . . . Coefficient setting interface
394 . . . Temperature setting interface
410A, 410B . . . Energy calculator
420 . . . Coefficient storage unit
440 . . . Bit inverter
450 . . . Comparator
460 . . . Write signal generating unit
470 . . . Multiplexer
500, 900 . . . Memory cell
510 . . . Substrate bias control line
520 . . . Word line
530 . . . First bit line
540 . . . Second bit line
550 . . . Pass gate transistor
560 . . . data holding unit
710 . . . initial temperature register
720 . . . Cooling coefficient register
730 . . . D/A converter
740 . . . Multiplier
750 . . . Re-heating condition register
760 . . . Re-heating determining device
770 . . . Current temperature register
810 . . . Power line
910 . . . Trip point control line
1010 . . . Power voltage control unit
1110 . . . Trip point control unit

The invention claimed is:

1. A semiconductor device comprising:
a first memory cell;
a second memory cell that interacts with the first memory cell; and
first and second registers,
wherein storage content of the first memory cell and the second memory cell is stochastically inverted,
wherein the storage content is stochastically inverted by changing threshold voltages of the first memory cell and the second memory cell,
wherein a control voltage for controlling the threshold voltages of the first memory cell and the second memory cell is changed with passage of time, and
when the control voltage reaches a condition designated by the first register, the control voltage is set to a voltage based on a value designated by the second register.

2. The semiconductor device according to claim 1, wherein the control voltage is a substrate bias.

3. The semiconductor device according to claim 1, wherein the control voltage is a power voltage.

4. The semiconductor device according to claim 1, wherein each of the first memory cell and the second memory cell includes a transistor for varying a trip point of the memory cell, and
the control voltage is a voltage applied to a gate of the transistor.

5. The semiconductor device according to claim 1, further comprising,
first and second calculators,
wherein the first calculator is configured to calculate an energy function having the first memory cell and the second memory cell as an input, and
the second calculator is configured to calculate an energy function having inverted values of the first memory cell and the second memory cell as an input.

6. The semiconductor device according to claim 1, wherein each of the first memory cell and the second memory cell includes a word line, a first bit line, and a second bit line,
the first bit line is able to perform reading and writing when the word line is activated, and
the second bit line is constantly able to perform reading.

7. The semiconductor device according to claim 1, wherein each of the first memory cell and the second memory cell is an SRAM memory cell including a pair of CMOS inverters.

8. The semiconductor device according to claim 6, wherein each of the first memory cell and the second memory cell is an SRAM memory cell including a pair of CMOS inverters.

9. A semiconductor device comprising:
a first memory cell; and
a second memory cell that interacts with the first memory cell,
wherein each of the first memory cell and the second memory cell is an SRAM memory cell including a pair of CMOS inverters;
storage content of the first and second memory cells is stochastically inverted;

a first register that sets temperature and energy;
a second register that sets temperature; and
a third register that holds current temperature and current energy,
wherein applied voltages of the first and second memory cells are changed with passage of time, and when content of the third register reaches a condition designated by the first register, a substrate bias is set to a voltage based on the temperature designated by the second register.

10. A semiconductor device comprising:
a first memory cell; and
a second memory cell that interacts with the first memory cell,
wherein each of the first memory cell and the second memory cell is an SRAM memory cell including a pair of CMOS inverters;
storage content of the first and second memory cells is stochastically inverted;
first and second calculators,
wherein the first calculator is configured to calculate an energy function having the first memory cell and the second memory cell as an input, and
the second calculator is configured to calculate an energy function having inverted values of the first memory cell and the second memory cell as an input.

11. The semiconductor device according to claim 9, further comprising,
first and second calculators,
wherein the first calculator is configured to calculate an energy function having the first memory cell and the second memory cell as an input, and
the second calculator is configured to calculate an energy function having inverted values of the first memory cell and the second memory cell as an input.

12. The semiconductor device according to claim 10,
wherein each of the first memory cell and the second memory cell includes a word line, a first bit line, and a second bit line,
the first bit line is able to perform reading and writing when the word line is activated, and
the second bit line is constantly able to perform reading.

13. The semiconductor device according to claim 9,
wherein each of the first memory cell and the second memory cell includes a word line, a first bit line, and a second bit line,
the first bit line is able to perform reading and writing when the word line is activated, and
the second bit line is constantly able to perform reading.

14. The semiconductor device according to claim 10,
wherein substrate biases of the first and second memory cells are controlled, and
the storage content is stochastically inverted by dropping threshold voltages of the first and second memory cells.

15. The semiconductor device according to claim 9,
wherein substrate biases of the first and second memory cells are controlled, and
the storage content is stochastically inverted by dropping threshold voltages of the first and second memory cells.

* * * * *